US012613296B2

(12) United States Patent
Otake et al.

(10) Patent No.: US 12,613,296 B2
(45) Date of Patent: Apr. 28, 2026

(54) HIGH-FREQUENCY COIL DEVICE AND MAGNETIC RESONANCE IMAGING APPARATUS USING THE SAME

(71) Applicant: FUJIFILM Healthcare Corporation, Kashiwa (JP)

(72) Inventors: Yosuke Otake, Chiba (JP); Koichi Arai, Chiba (JP); Asuka Ikeda, Chiba (JP)

(73) Assignee: FUJIFILM Corporation, Tokyo (JP)

( * ) Notice: Subject to any disclaimer, the term of this patent is extended or adjusted under 35 U.S.C. 154(b) by 105 days.

(21) Appl. No.: 18/376,530

(22) Filed: Oct. 4, 2023

(65) Prior Publication Data

US 2024/0142551 A1      May 2, 2024

(30) Foreign Application Priority Data

Oct. 31, 2022      (JP) ................................. 2022-174650

(51) Int. Cl.
*G01R 33/34* (2006.01)
*G01R 33/3415* (2006.01)
*G01R 33/36* (2006.01)
*G01R 33/385* (2006.01)

(52) U.S. Cl.
CPC ...  *G01R 33/3415* (2013.01); *G01R 33/34046* (2013.01); *G01R 33/3621* (2013.01); *G01R 33/385* (2013.01)

(58) Field of Classification Search
CPC .......... G01R 33/3415; G01R 33/34046; G01R 33/3621; G01R 33/385; G01R 33/34084; G01R 33/365; G01R 33/34; G01R 33/34076; G01R 33/48
See application file for complete search history.

(56) References Cited

U.S. PATENT DOCUMENTS 5,552,707 A       9/1996  Takahashi et al.
2005/0007116 A1   1/2005  Davis
(Continued)

FOREIGN PATENT DOCUMENTS

JP      H07-059751 A       3/1995
JP      2005-028141 A      2/2005
(Continued)

OTHER PUBLICATIONS

Mar. 26, 2024 European search report in connection with European Patent Application No. 23 20 2258.
(Continued)

*Primary Examiner* — Amal Aly Farag
(74) *Attorney, Agent, or Firm* — Paul Teng

(57) ABSTRACT
A high-frequency coil device can maintain a distance between coils at any mounting position in an RF coil including a movable coil unit and can achieve a uniform sensitivity distribution and high sensitivity. A first coil unit configured to move along a substantially circular trajectory and a second coil unit fixed within the substantially circular trajectory are provided, the first coil unit and the second coil unit are disposed at substantially point-symmetric positions, and magnetic coupling between conductor loops provided in both the coil units is maintained substantially constant in a movable range of the first coil unit.

14 Claims, 11 Drawing Sheets

(56)            References Cited

U.S. PATENT DOCUMENTS

| | | | | |
|---|---|---|---|---|
| 2005/0225326 | A1* | 10/2005 | He | G01R 33/3415 |
| | | | | 324/309 |
| 2012/0293176 | A1 | 11/2012 | Zink | |
| 2020/0158800 | A1* | 5/2020 | Taracila | A61G 13/121 |
| 2022/0137165 | A1* | 5/2022 | Hong | G01R 33/3664 |
| | | | | 600/422 |

FOREIGN PATENT DOCUMENTS

| | | | |
|---|---|---|---|
| JP | 2007-330795 | A | 12/2007 |
| JP | 2008-154933 | A | 7/2008 |
| JP | 6195731 | B | 8/2017 |
| JP | 2021-137338 | A | 9/2021 |
| JP | 2022-521611 | A | 4/2022 |
| WO | WO2018/098255 | A | 5/2018 |

OTHER PUBLICATIONS

Feb. 24, 2026 Japanese official action (and English language translation thereof) in connection with corresponding Japanese Patent Application No. 2022-174650.

* cited by examiner 90 deg 45 deg 0 deg

CIRCLE

RECTANGLE

MODIFIED RECTANGLE

8-LIKE SHAPE

POLYGONAL
TRAJECTORY

330"

21

11

ELLIPTICAL
TRAJECTORY

330'

21

11

45 deg 0 deg 90 deg

FIG. 8

HIGH-FREQUENCY COIL DEVICE AND MAGNETIC RESONANCE IMAGING APPARATUS USING THE SAME

CROSS-REFERENCE TO RELATED APPLICATION

The present application claims priority from Japanese patent application 2022-174650 filed on Oct. 31, 2022, the content of which is hereby incorporated by reference into this application.

BACKGROUND OF THE INVENTION

1. Field of the Invention

The present invention relates to a high-frequency coil device used as an RF coil of a magnetic resonance imaging (MRI) apparatus.

2. Description of the Related Art

In an MRI apparatus, a high-frequency magnetic field is applied to a subject under examination disposed in a static magnetic field space, and a nuclear magnetic resonance signal generated from the subject under examination in response to the application is collected to generate an image of the subject under examination. The high-frequency coil (RF coil) used to apply the high-frequency magnetic field and receive the nuclear magnetic resonance signal is required to have high and uniform sensitivity in order to obtain a high-quality image. In particular, the RF coil for reception can improve reception sensitivity by being closely attached and mounted onto the subject under examination.

In the MRI apparatus, in order to achieve close contact with the subject under examination and high sensitivity, multi-array coils in which a plurality of small coils are combined into one coil device are widely used. In such multi-array coils, in order to obtain high sensitivity, elements (conductor loops) constituting each individual coil are regularly designed to partially overlap each other such that the electromagnetic interference between the coils is suppressed (for example, WO2018/098255A).

However, since the size and shape of the subject under examination on which the coils are mounted vary depending on the subject under examination, it is difficult to maintain a regular arrangement in closely attaching coils to the subject under examination. A circuit structure for suppressing electromagnetic interference has also been developed, but interference is not completely eliminated.

Therefore, in order to ensure high sensitivity, it is still important to maintain a regular arrangement such that the elements (conductor loops) partially overlap each other.

Meanwhile, for an RF coil where close contact with the subject under examination is difficult, such as a head coil, a coil device designed to be mounted on the subject under examination by combining a plurality of coil units with regularly arranged elements and configuring these coil units to be movable has also been proposed (JP6195731B and JP2021-137338A).

SUMMARY OF THE INVENTION

In the coil device provided with movable coil units, it is possible to maintain a regular arrangement of elements for each individual coil unit, but a positional relationship changes between the coil units by making any of the coil units movable. Therefore, in a mounting position, a positional relationship between a loop constituting one coil unit and a loop constituting another coil unit changes depending on the size of the mounted subject under examination and the mounting method, and this change in the positional relationship may sometimes lead to electromagnetic interference and a decrease in sensitivity, despite efforts to arrange the elements to suppress electromagnetic interference.

For example, the head RF coil disclosed in JP2021-137338A employs a configuration in which a mask-like coil unit that covers a part of a patient's face from the top of the head is made movable to allow the mask-like coil unit to be closely attached to the face depending on the size of the subject, but the positional relationship between the movable mask-like coil unit and a fixed coil disposed at the back of the head varies depending on a large head size or a small head size, which makes it difficult to maintain the positional relationship for suppressing electromagnetic interference.

An object of the present invention is to provide a high-frequency coil device that can maintain a distance between coils at any mounting position in an RF coil including a movable coil unit as described above and that can achieve a uniform sensitivity distribution and high sensitivity.

The present invention enables mounting on a subject under examination while maintaining a positional relationship between coils by devising a trajectory of a movable coil in the high-frequency coil device having a plurality of coil units whose positions are variable relative to each other.

That is, according to an aspect of the present invention, there is provided a high-frequency coil device for magnetic resonance imaging, comprising: a first coil unit having at least one conductor loop; and a second coil unit having at least one conductor loop, in which the first coil unit and the second coil unit have variable relative positions and are movable while maintaining electromagnetic coupling between a conductor loop of the first coil unit and an adjacent conductor loop of the second coil unit in at least a part of a movable range.

In addition, according to another aspect of the present invention, there is provided a high-frequency coil device comprising: a first coil unit configured to move along a circular trajectory; and a second coil unit fixed within the circular trajectory, in which the first coil unit and the second coil unit are disposed at substantially point-symmetric positions.

Further, according to still another aspect of the present invention, there is provided an MRI apparatus comprising: the high-frequency coil according to each of the above aspects as at least one high-frequency coil of an RF reception coil or an RF transmission coil.

According to the aspects of the present invention, the movable RF coil moves along a predetermined trajectory with respect to the fixed RF coil, and at that time, the relationship between the two, the distance between the coils for maintaining the magnetic coupling between the coils, or the overlapping area, is maintained. Therefore, fluctuations in electromagnetic interference can be suppressed, and a uniform sensitivity distribution can be achieved. In addition, since at least one coil unit is movable, close contact with the subject under examination can be improved, and high sensitivity can be achieved.

BRIEF DESCRIPTION OF THE DRAWINGS

FIG. 8 is a diagram showing a movement of a high-frequency coil of the embodiment of FIG. 6.

DESCRIPTION OF THE PREFERRED EMBODIMENTS

Hereinafter, embodiments of a high-frequency coil device according to the present invention will be described with reference to the drawings. In the following description, as an example, a case where the high-frequency coil device functions as a reception coil of an MRI apparatus will be described.

Figure 1:
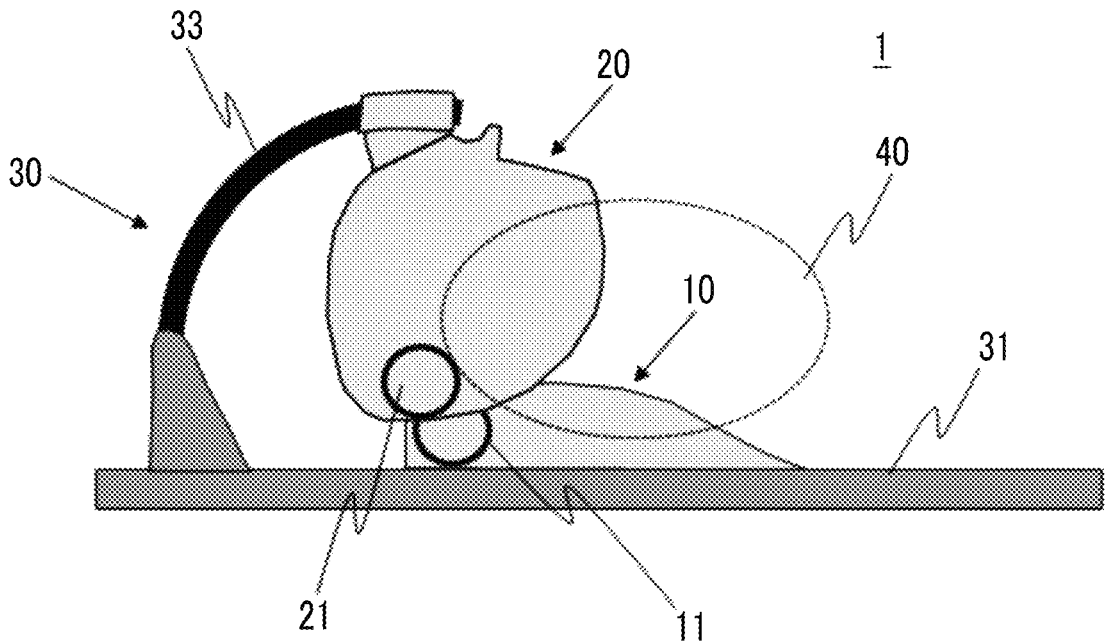
FIG. 1 is a diagram showing an embodiment of a high-frequency coil device according to the present invention.

As shown in FIG. 1, a high-frequency coil device 1 of the present embodiment comprises, as a basic structure, one RF coil unit 10, an RF coil unit 20 whose position with respect to the RF coil unit 10 changes, and a mechanism unit 30 for moving the RF coil unit 20 with respect to the RF coil unit 10. The movement of the RF coil unit 20 with respect to the RF coil unit 10 is relative, which means that one is movable in a case where the other is fixed, and also includes, for example, a case where both are movable. Here, in order to simplify the description, it is assumed that the RF coil unit 10 is fixed and the RF coil unit 20 is movable.

The high-frequency coil device 1 of the present embodiment has a structure in which positions of a plurality of coil units are changed relative to each other as described above, and this configuration facilitates mounting work on the examination target (each part of a human body) and maintains close contact during mounting.

The RF coil unit 10 and the movable RF coil unit 20 comprise at least one conductor loop 11 and at least one conductor loop 12, respectively. Each of the conductor loops 11 and 12 is adjusted to receive a nuclear magnetic resonance signal of the MRI apparatus. The adjustment is performed by the conductor loop itself (conductor), a capacitor attached to the conductor loop, or the like. The RF coil unit 10 and the movable RF coil unit 20 may each be a multi-array coil in which a plurality of conductor loops are connected in a predetermined arrangement. In this case, the plurality of conductor loops are each adjusted to receive the nuclear magnetic resonance signal and are arranged to minimize electromagnetic interference in the overlapping between conductors.

The mechanism unit 30 includes, for example, a fixing unit 31 to which the RF coil unit 10 is fixed, and a movable unit 33 that is fixed to the fixing unit 31 and moves the RF coil unit 20 along a predetermined trajectory. In a case where the high-frequency coil device 1 of the present embodiment is mounted on an examination part such as a head of the subject under examination, the RF coil unit 20 is moved along the predetermined trajectory, for example, in a state in which the examination part is placed on the RF coil unit 10 fixed to the fixing unit 31, and the RF coil unit 10 and the RF coil unit 20 are mounted to cover the examination part.

Here, for example, in the conventional movable high-frequency coil in which the movable coil is abutted and mounted from both side surfaces or an upper surface of the head of the subject under examination, the position with the movable coil disposed on the back side of the head changes in an anteroposterior direction, and the distance between the two changes depending on the size of the subject under examination in a state in which the movable coil is closely attached to the head. That is, in a large-headed subject under examination, the fixed coil and the movable coil have a relatively distant positional relationship, and in a small-headed subject under examination, the fixed coil and the movable coil are closer to each other, and electromagnetic coupling changes at each position. That is, even in a case where the adjustment is performed to suppress the electromagnetic coupling for each coil, the balance of the adjustment of the electromagnetic coupling of all the conductor loops is disrupted when assembled into the high-frequency coil device.

The high-frequency coil device 1 of the present embodiment is provided with the movable unit 33 that moves the movable RF coil unit 20 with respect to the RF coil unit 10 such that a movement trajectory of a conductor loop (second conductor loop) 21 located adjacent to a conductor loop (first conductor loop) 11 of the RF coil unit 10, among the conductor loops constituting the RF coil unit 20, has a trajectory for maintaining substantially the same overlapping area with the first conductor loop 11, so that the electromagnetic coupling between both the coil units 10 and 20 is maintained in the adjusted range.

Figure 2C:
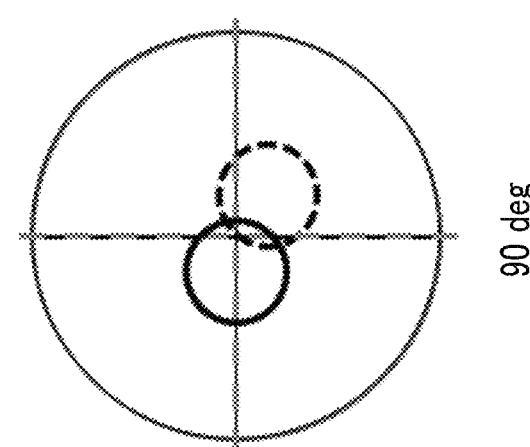
FIGS. 2A to 2C are diagrams showing a positional relationship between two conductor loops at each position in a movable range of a movable coil unit.
Figure 2B:
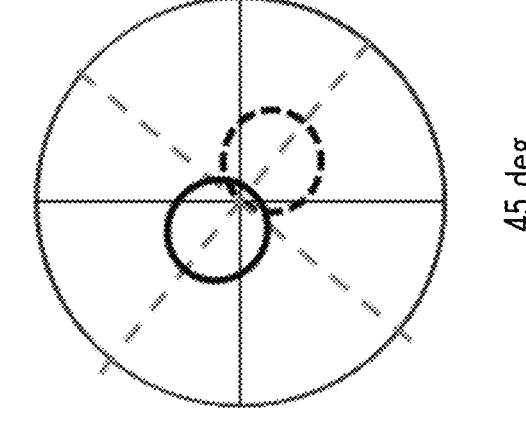
Figure 2A:
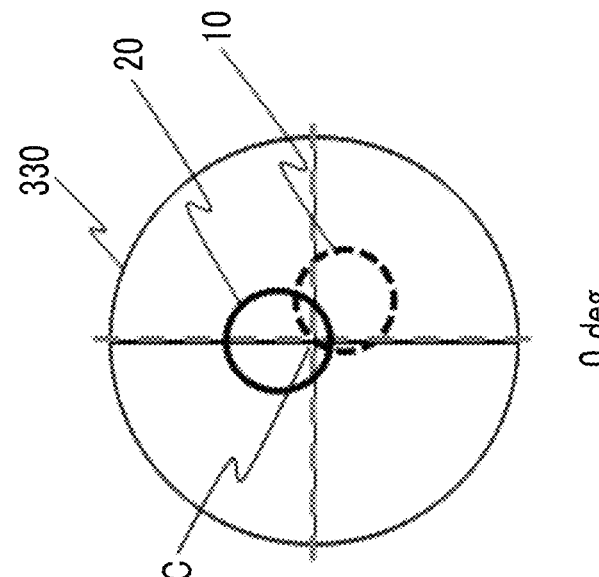

Specifically, as shown in FIGS. 2A to 2C, a trajectory 330 of the movable RF coil unit 20 has an approximately circular trajectory, and a center C thereof is located within a region where the second conductor loop 21 of the RF coil unit 20 and the first conductor loop 11 of the RF coil unit 10 overlap. As a result, in a case where the RF coil unit 20 is moved from FIGS. 2A to 2C, the positional relationship between the second conductor loop 21 and the first conductor loop 11, specifically, the distance between the center of the second conductor loop 21 and the center of the first conductor loop 11, is maintained substantially constant, and the overlapping area between both the conductor loops, which affects electromagnetic coupling, is maintained substantially constant.

In the example shown in FIGS. 2A to 2C, in a case where it is assumed that a position of the movable RF coil unit 20 shown in FIG. 2A is 0 degrees, the overlapping area between both the conductor loops is maintained constant up to the position shown in FIG. 2C with 90 degrees. However, the range in which the overlapping area is maintained constant need only be located at a position close to the examination target without the need to maintain the entire movable range of the movable RF coil unit constant. The circular trajectory need only be maintained, for example, in a range in which adjustment can be performed between a large-sized patient and a small-sized patient or between a fixed position of a claustrophobic patient and a fixed position of a normal patient, such as a range of about 15 to 20 degrees. That is, the trajectory of the movable range may partially include a linear trajectory in which the movable RF coil unit is moved linearly such as in a horizontal direction, a vertical direction, and an oblique direction.

Figure 3A:
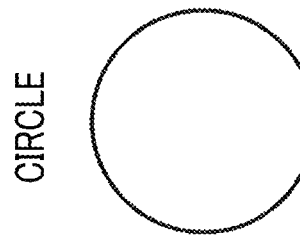
FIGS. 3A to 3D are each a diagram showing an embodiment of a shape of the conductor loop.
Figure 3B:
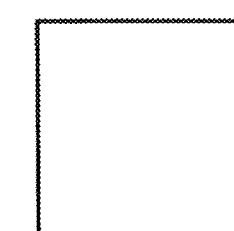
Figure 3C:
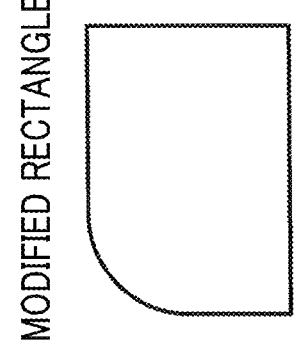
Figure 5:
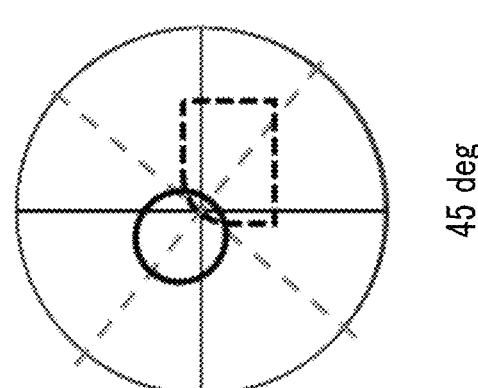
FIG. 5 is a diagram showing a positional relationship between conductor loops at each position in a movable range in a case where a modified rectangular conductor loop is used.
Figure 5:
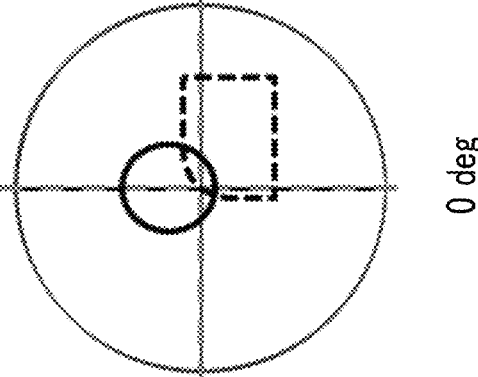

As shown in FIGS. 3A to 3D, various shapes can be employed as the shapes of the conductor loops 11 and 21, and any shape can be used to form any sensitivity. Further, as shown in FIG. 3C, by making a part of the rectangle arc-shaped, as shown in FIG. 5, it becomes easier to control the area of the portion where the two conductor loops 11 and 21 overlap, and it is possible to maintain a change in the overlapping area due to the movement of the RF coil unit 20 minimized.

Figure 3D:
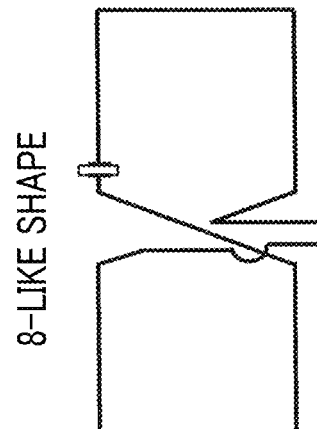

FIG. 3D shows an example of an 8-like shaped loop that includes a portion where the conductor loops cross. By employing such a conductor loop, depth sensitivity can be easily obtained. In addition, by making the shape of the overlapping portion of the 8-like shaped loop arc-shaped, similar effects to the coil shape of FIG. 3C can be obtained.

Figure 4:
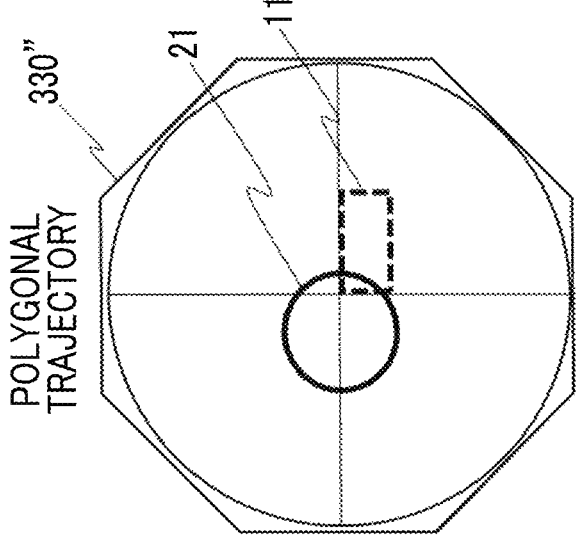
FIG. 4 is a diagram showing an example of a trajectory in which the movable coil unit moves.
Figure 4:
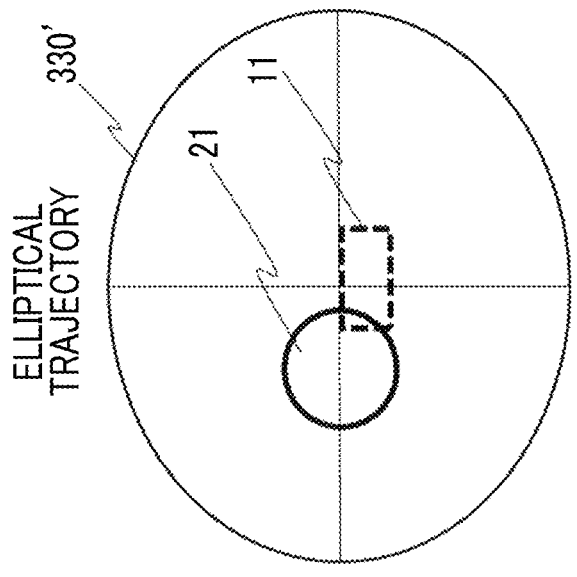

Further, the trajectory of the movable RF coil unit for maintaining the above-described positional relationship between the second conductor loop 21 and the first conductor loop 11 is not limited to the circular trajectory as long as the change in the overlapping area between the conductor loops can be minimized, and can be appropriately changed in accordance with the shape of the conductor loop. FIG. 4 shows examples of elliptical and polygonal trajectories 330' and 330" in a case where one of the conductor loops is rectangular. In a case of the elliptical trajectory, since there are two trajectory centers, the trajectory of the second conductor loop 21 is determined such that one of these centers is present in a region where the two conductor loops overlap. Although the example of FIG. 4 shows a case where the conductor loop 11 of the fixed RF coil unit 10 is rectangular, conversely, the conductor loop 21 of the movable RF coil unit 20 may be rectangular.

According to the present embodiment, the movable unit 33 is configured to move the movable RF coil unit 20 along the fixed RF coil unit 10, so that across subjects under examination with various sizes, the coil units can always be mounted on subjects under examination with different mounting positions with good operability and in a closely attached state, and uniform sensitivity can be maintained.

Embodiment 1

Although the basic structure of the high-frequency coil device of the present embodiment and its movement have been described above, an embodiment of a specific structure of the high-frequency coil device will be described below. In this embodiment, a specific mechanism for realizing the trajectory of the movable RF coil, which is a feature of the present invention, will be described based on the structure of the head coil disclosed in JP2021-137338A.

First, the structure of the above-described head coil will be described with reference to FIG. 6. A head coil 1A includes a plate-shaped fixing unit 31, the RF coil unit 10 fixed to the fixing unit 31, the RF coil unit 20 movable with respect to the fixed RF coil unit 10, and the movable unit 33 of which one end is fixed to the fixing unit 31 and the other end is attached to the movable RF coil unit 20. The RF coil unit 10 and the RF coil unit 20 are each a multi-array coil in which a plurality of conductor loops are arranged in a predetermined arrangement, and each conductor loop is adjusted by a capacitor (not shown) or the like to receive the nuclear magnetic resonance signal, and the overlapping between the conductor loops is adjusted. Further, the conductor loops constituting these coil units, and the capacitor or the like, which is an adjustment element, are fixed to a flexible member, such as an insulating resin, molded into a predetermined shape such that the conductor loops are arranged in a predetermined arrangement. Hereinafter, the RF coil unit 10 and the RF coil unit 20, including their respective conductors and all members that fix the conductors, will be referred to as a fixed coil and a movable coil, respectively.

Figure 6:
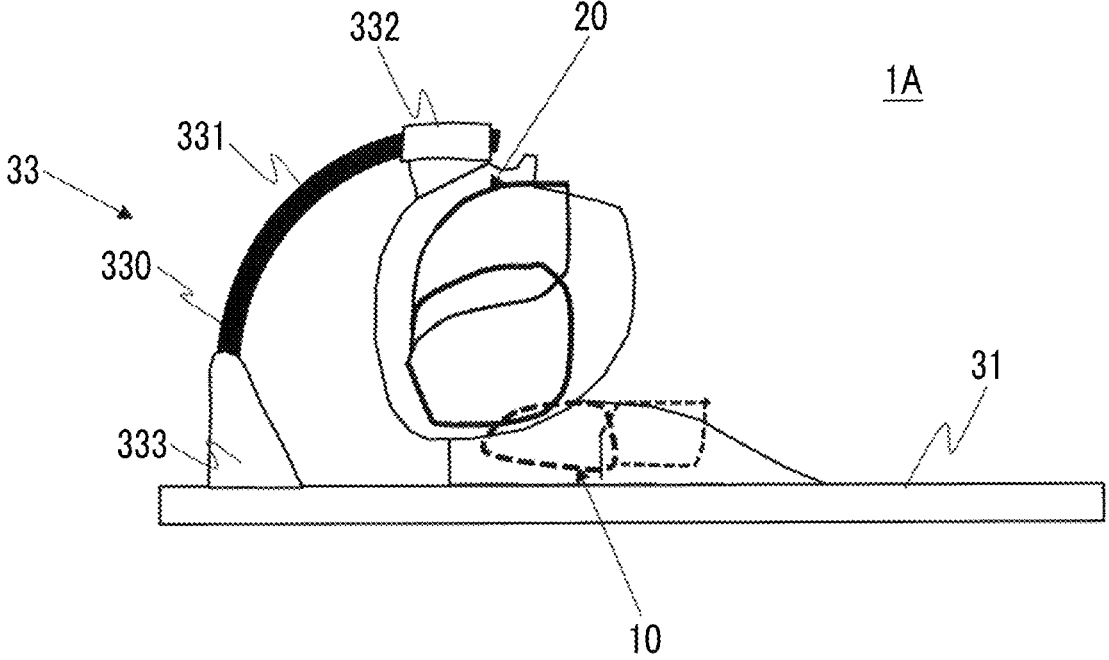
FIG. 6 is a diagram showing an embodiment including a movable unit of the high-frequency coil device according to the present invention.

In FIG. 6, the conductor loops of the movable coil 20 are indicated by solid lines, and the conductor loops of the fixed coil 10 are indicated by dotted lines, and among these conductor loops, the conductor loop of the movable coil 20 and the conductor loop of the fixed coil 10 adjacent to each other are indicated by thick lines. Further, although two conductor loops are shown for each of the movable coil 20 and the fixed coil 10 in FIG. 6, for example, three or more conductor loops may be arranged to cover the head while maintaining appropriate magnetic coupling with each other.

The fixed coil 10 is closely attached to the back of the head by placing the head on the fixed coil 10. The movable coil 20 is fixed to a flexible member, such as an insulating resin, molded into a mask-like shape such that conductor loops are arranged in a predetermined arrangement, and is mounted to cover at least a part of the face from the top of the head of the human body.

The movable unit 33 includes a rail 331 that provides a predetermined trajectory, a slider 332 that fixes the movable coil 20 and moves along the rail 331, and a support portion 333 that fixes the rail 331 to the fixing unit 31.

In the shown embodiment, the rail 331 is arc-shaped as a whole, and the slider 332 moves along the arc-shaped rail 331, so that the movable coil 20 is configured to move along a trajectory determined by the shape of the rail.

Although not shown, locking means for fixing the slider to the rail 331 at any position may be provided between the rail 331 and the slider 332. For example, as the locking means, a spring member or the like may be employed to incrementally connect the slider 332 and the rail 331. A latch, a ratchet, or the like may also be used.

Figure 7A:
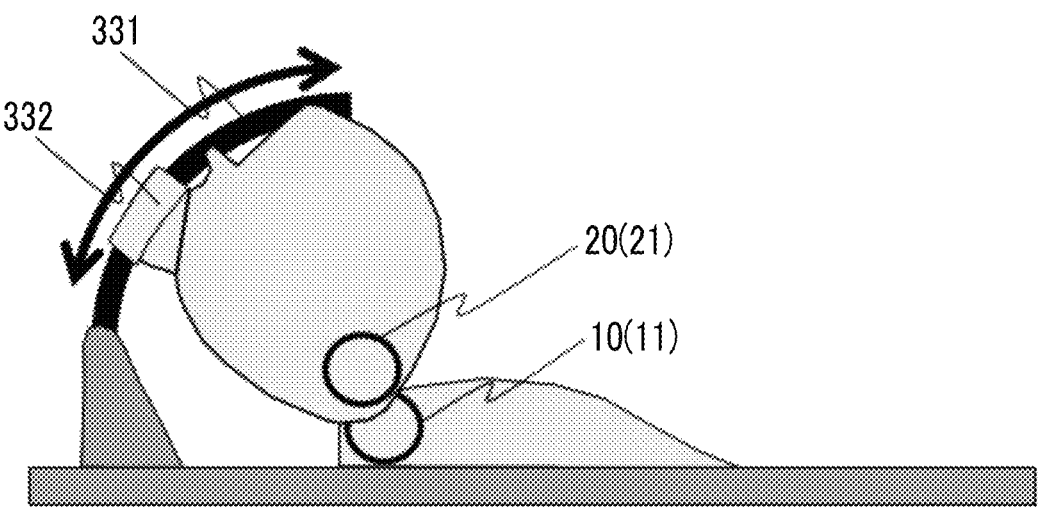
FIGS. 7A and 7B are diagrams showing Embodiment 1 of the movable unit.
Figure 7B:
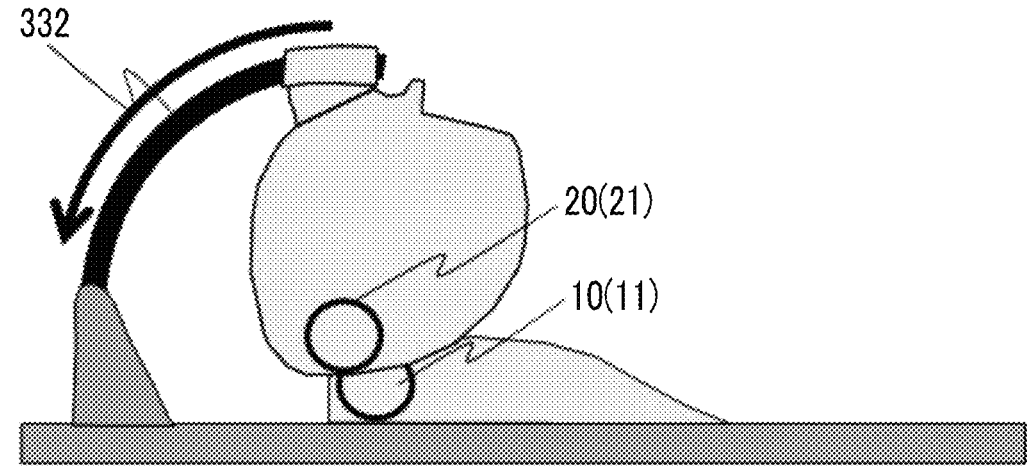
Figure 8:
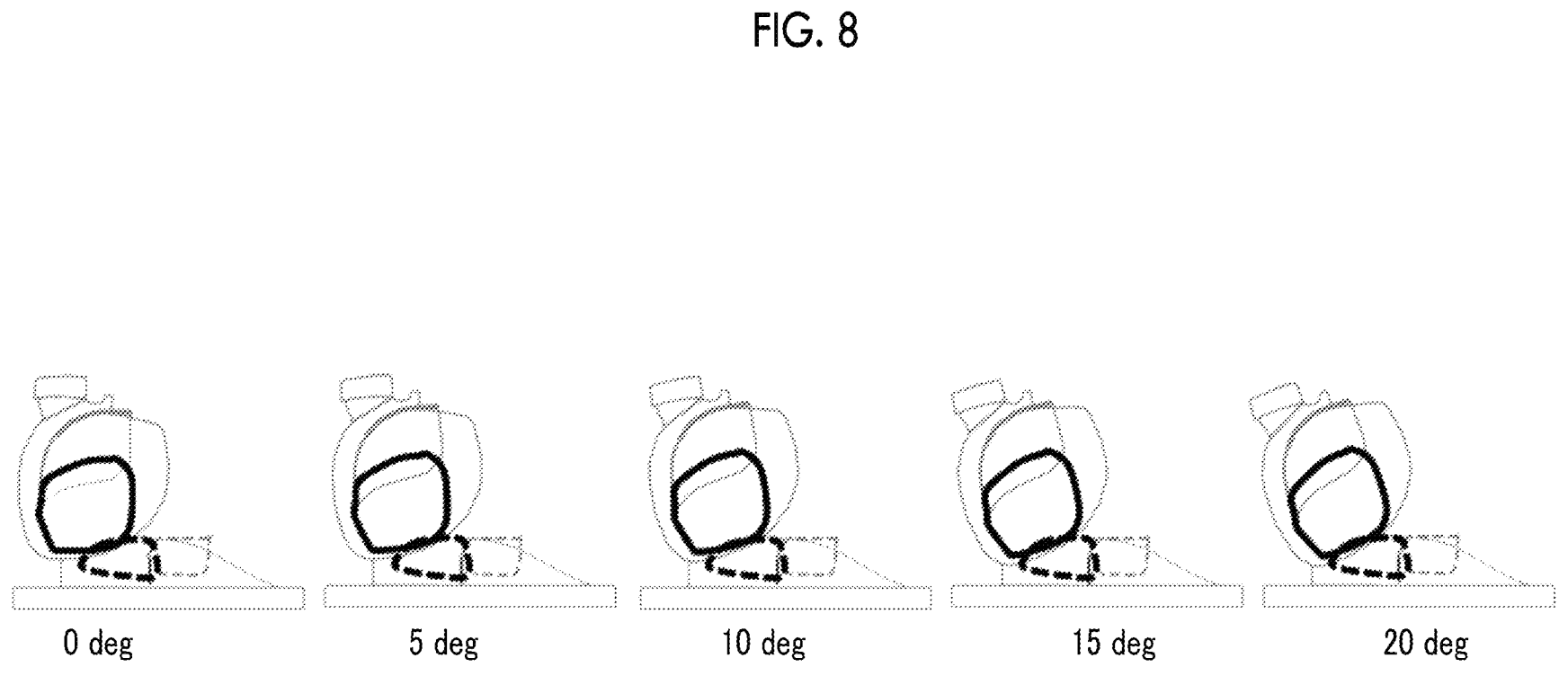

With such a configuration, as shown in FIGS. 7A and 7B, the movable coil 20 is moved along the rail 331, so that the movable coil 20 can be moved from a position (a retracted position of FIG. 7A) retracted from an upper surface of the fixed coil 10 to a position (a mounting position of FIG. 7B) where the movable coil 20 overlaps the upper surface. FIG. 8 shows a change in the positional relationship between the conductor loops 21 and 11, from the mounting position of the movable coil 20 to a position where the movable coil 20 tilts to the rear of the RF coil unit 10 (within the range of 0 degrees to 20 degrees). In FIG. 8, the conductor loops 21 and 11 located at the closest positions are indicated by thick lines, and the other conductor loops are indicated by thin lines. As can be seen from FIG. 8, the overlapping portion of the two conductor loops 21 and 11 is located within a range of 0 degrees to 20 degrees with almost no change.

With the high-frequency coil device 1A of the present embodiment, the movable coil 20 is configured to move along the rail 331 that provides the circular trajectory, whereby the overlapping area between the conductor loop 21 constituting the movable coil 20 and the conductor loop 11 of the fixed coil 10 closest to the conductor loop 21 can be maintained substantially constant. As a result, as long as a range in which the overlapping area is maintained is used, the relationship between the conductor loops initially set to minimize the electromagnetic interference can be maintained regardless of the mounting position where the movable coil 20 is fixed, and high and uniform sensitivity can be achieved.

The combination of the rail 331 and the slider 332 is shown as the movable unit 33 in FIG. 6. However, as means for providing the trajectory of the movable coil, not only the combination of the rail and the slider but also a member such as a grooved rail and a hook that engages with the groove can also be employed as long as a member that guides the movement of the movable coil 20 along the predetermined trajectory is used.

In the present embodiment, the positional relationship between the second conductor loop 21 and the first conductor loop 11, specifically, the distance between the center of the second conductor loop 21 and the center of the first conductor loop 11, is maintained substantially constant, and the overlapping area between both the conductor loops, which affects the electromagnetic coupling, is maintained substantially constant, but the present invention is not limited to this. For example, both conductor loops need not overlap. As long as the distance between both the conductor loops is maintained substantially constant and the value of magnetic coupling is maintained, sensitivity as the high-frequency coil device can be maintained.

Embodiment 2

Figure 9:
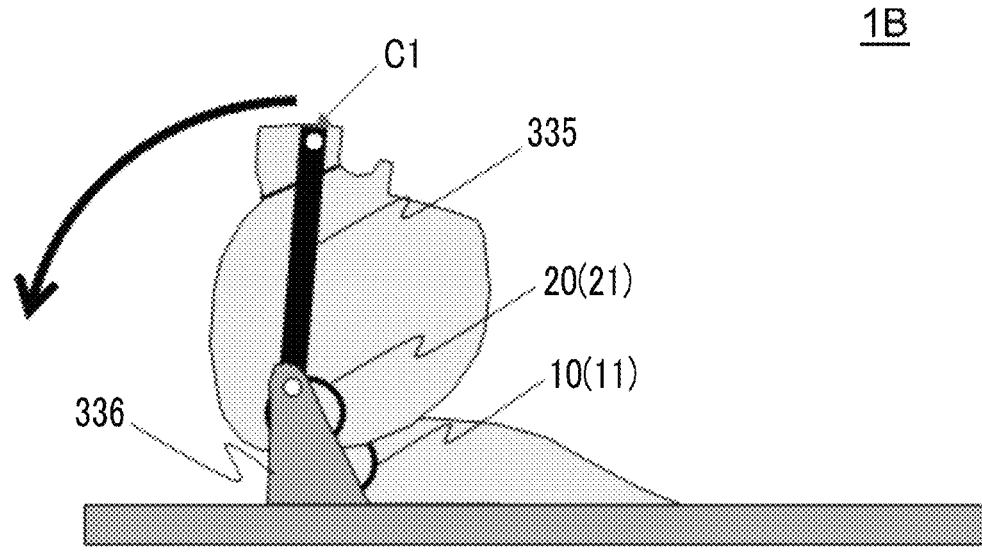
FIG. 9 is a diagram showing Embodiment 2 of the movable unit.
Figure 9:
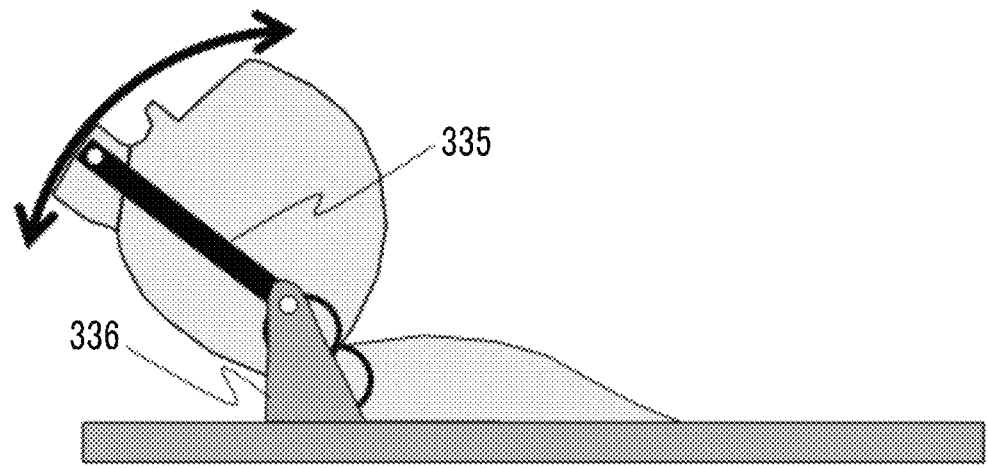

FIG. 9 shows a high-frequency coil device 1B of Embodiment 2 having a structure different from the movable unit 33. As shown in FIG. 9, the movable unit 33 of Embodiment 2 is composed of an arm portion 335 that fixes the movable coil 20 and a support portion 336 that supports the arm portion 335 in a rotationally movable manner. The arm portion 335 is a member having a shape extending from a center C1 of the movable coil 20 toward both side surfaces along the curved surface of the movable coil 20, and end parts on side surface sides are supported by the support portions 336 provided at two locations corresponding to both the left and right sides of the subject under examination.

In this configuration, the arm portion 335 moves in a circular shape with a distance determined by a distance between the end part fixed to the support portion 336 and the center portion to which the mask-like movable coil 20 is fixed as a radius, whereby the mask-like movable coil 20 fixed to the center of the arm portion 335 can be moved along the circular trajectory. As a result, similarly to the high-frequency coil device 1A shown in FIG. 6, the effect of maintaining the relationship between the conductor loops initially set to minimize the electromagnetic interference can be obtained regardless of the mounting position where the RF coil unit 20 is fixed.

In the present embodiment as well, means (for example, a latch, a ratchet, a tightening bolt, or the like) for stopping the arm portion 335 at any position can be provided between the arm portion 335 and the support portion 336 to which the arm portion 335 is fixed, whereby the RF coil unit can be installed at a stable mounting position.

Although the embodiment of the high-frequency coil device according to the present invention has been described above, the high-frequency coil device of the embodiment of the present invention is not limited to the embodiments shown in the drawings, and the configuration, the shapes, the combinations, the arrangements, and the like of the conductor loops can be changed. In addition, in the above-described embodiment, the high-frequency coil device comprising the two coil units has been described, but a third RF coil unit as disclosed in JP2021-137338A and the like, for example, a pair of RF coil units installed at side surfaces of the subject under examination, can also be added.

In addition, in the above-described embodiment, a case where the present invention is mainly applied to the head coil has been described, but the present invention can be applied to not only the head coil but also a high-frequency coil device configured such that two or more coil units, at least one of which is movable and in which the positions of the coil units are variable, are mounted, and modifications corresponding to the mounting position can be made.

Embodiment of MRI Apparatus

The MRI apparatus of the embodiment of the present invention comprises the high-frequency coil device of the embodiment of the present invention in at least one of the RF reception coil or the RF transmission coil. Since the configurations other than the high-frequency coil device are the same as those of a general MRI apparatus, detailed description thereof will be omitted, and only an outline of the apparatus will be described.

Figure 10:
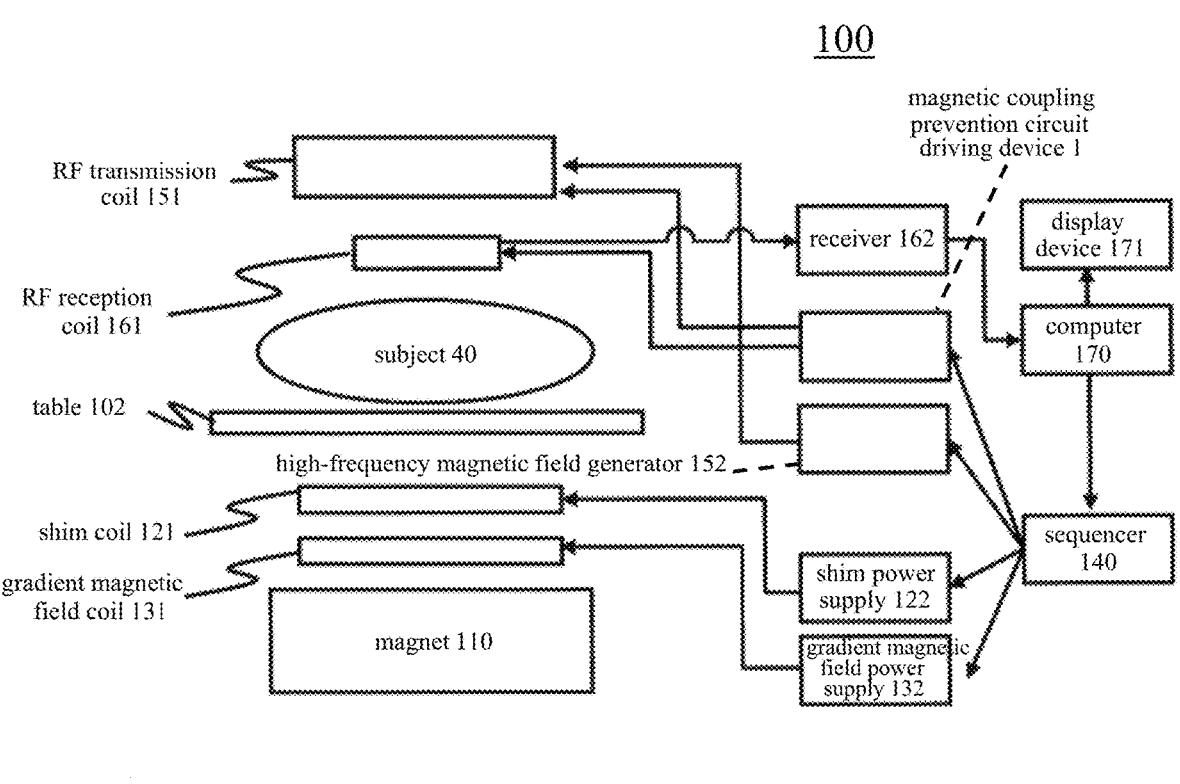
FIG. 10 is a diagram showing an outline of an MRI apparatus to which the present invention is applied.

FIG. 10 is a block diagram showing a schematic configuration of an MRI apparatus 100. As shown in this drawing, the MRI apparatus 100 comprises a horizontal magnetic field type magnet 110, a gradient magnetic field coil 131, an RF transmission coil 151, an RF reception coil 161, a gradient magnetic field power supply 132, a shim coil 121, a shim power supply 122, a high-frequency magnetic field generator 152, a receiver 162, a magnetic coupling prevention circuit driving device 180, a computer (PC) 170, a sequencer 140, and a display device 171. A subject under examination 40 is disposed on a table 102 and is disposed in a static magnetic field space formed by the magnet 110.

The gradient magnetic field coil 131 is connected to the gradient magnetic field power supply 132 to generate a gradient magnetic field. The shim coil 121 is connected to the shim power supply 122 to adjust the uniformity of the magnetic field. The RF transmission coil 151 is connected to the high-frequency magnetic field generator 15 and emits (transmits) the high-frequency magnetic field to the subject under examination 40. The RF reception coil 161 is connected to the receiver 162 and receives the nuclear magnetic resonance signal from the subject under examination 40. The magnetic coupling prevention circuit driving device 180 is connected to a magnetic coupling prevention circuit (e.g., 210, 220 coupled to RF coil 151A and array coil 161A, respectively, in FIG. 11). The magnetic coupling prevention circuit is a circuit that is connected to each of the RF transmission coil 151 and the RF reception coil 161 to prevent magnetic coupling between the RF transmission coil 151 and the RF reception coil 161.

The sequencer 140 sends commands to the gradient magnetic field power supply 132, the high-frequency magnetic field generator 152, and the magnetic coupling prevention circuit driving device 180 to operate each of them. The command is sent out in accordance with an instruction from the computer (PC) 170. In addition, in accordance with the instruction from the computer (PC) 170, a magnetic resonance frequency to be used as a reference for demodulation by the receiver 162 is set. For example, in accordance with the command from the sequencer 140, the high-frequency magnetic field is emitted to the subject under examination 40 through the RF transmission coil 151. The nuclear magnetic resonance signal generated from the subject under examination 40 irradiated with the high-frequency magnetic field is detected by the RF reception coil 161 and is demodulated by the receiver 162.

The computer (PC) 170 also functions as a signal processing unit that controls the operation of the entire MRI apparatus 100 and that performs various types of signal processing. For example, the signal demodulated by the receiver 162 is received via an A/D conversion circuit and performs signal processing such as image reconstruction. The result is displayed on the display device 171. The demodulated signal and measurement conditions are stored in a storage medium as necessary. In addition, a command is sent out to the sequencer 140 such that each device operates at a timing and intensity programmed in advance. Further, in a case where it is necessary to adjust the static magnetic field uniformity, the sequencer 140 sends a command to the shim power supply 122 to cause the shim coil 121 to adjust the magnetic field uniformity.

Figure 11:
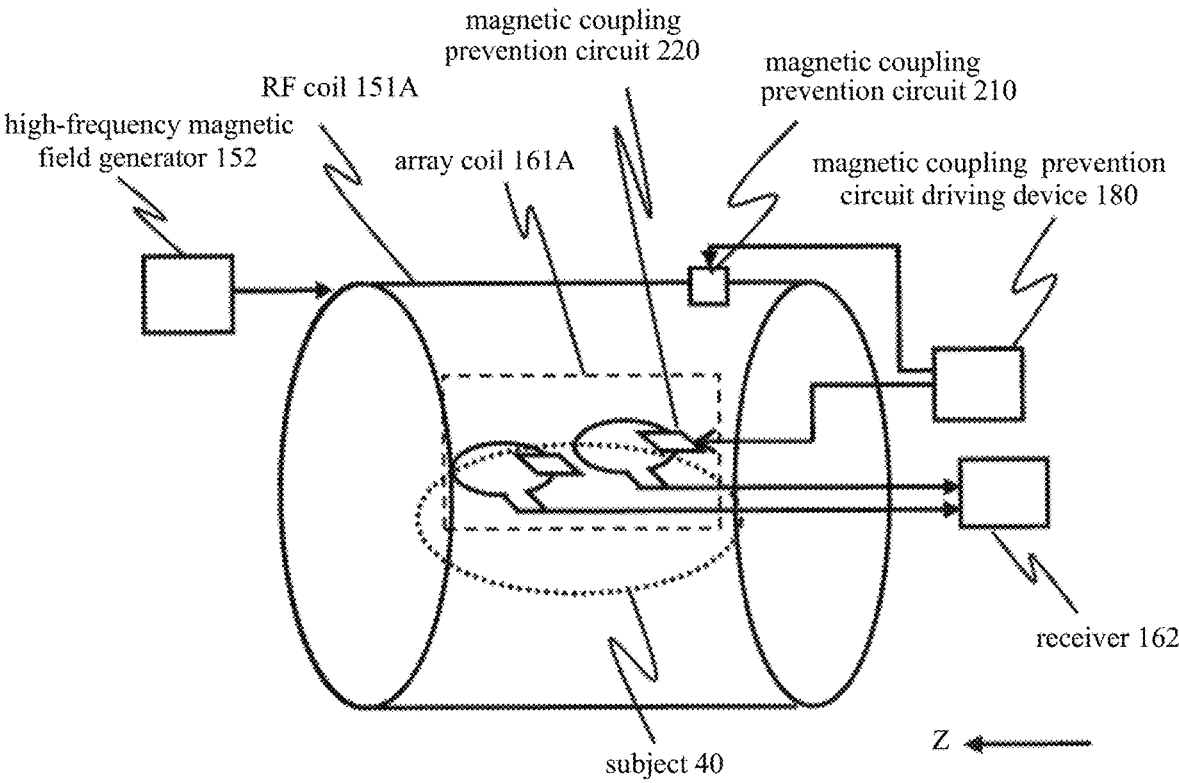
FIG. 11 is a diagram showing an example of an RF coil (high-frequency coil device) of the MRI apparatus of FIG. 10.

Next, a configuration example of the RF transmission coil 151 and the RF reception coil 161 of the present embodiment is shown in FIG. 11. In FIG. 11, as an example, a case is shown where an RF coil (birdcage-type RF coil) 151A having a birdcage-type shape is used as the RF transmission coil 151, and an array coil 161A in which a plurality of RF coils (surface coils) having loop shapes are arranged is used as the RF reception coil 161. Although FIG. 11 shows two surface coils (sub-coils) constituting the array coil 161A, the number of sub-coils may be three or more, or may be one.

The resonance frequency of the birdcage-type RF coil 151A used as the RF transmission coil 151 is adjusted to a resonance frequency of an element to be excited, for example, a magnetic resonance frequency of hydrogen nuclei, which allows excitation of hydrogen nuclei. The array coil 161A used as the RF reception coil 161 is adjusted to be capable of detecting the nuclear magnetic resonance signals of an element that can be excited by the birdcage-type RF coil 151A.

The MRI apparatus of the present embodiment comprises, as the RF reception coil 161, the high-frequency coil devices 1, 1A, or 1B for the head as shown in FIG. 1, 6, or 9, that is, the RF coil unit (fixed coil) 10 fixed to the fixing unit 31 and the movable RF coil unit (movable coil) 20 that is supported by the movable unit 33 and whose position can be changed with respect to the RF coil unit 10.

In a case where the high-frequency coil device 1 is mounted on the subject under examination, the high-frequency coil device 1 is installed on the table 102 inserted into an examination space of the MRI apparatus, and the head of the subject under examination is placed on the fixed coil 10 in a state in which the movable coil 20 is located at a retracted position (FIG. 7A) away from the fixed coil 10. Next, the movable coil 20 is moved from the retracted position along the head of the subject under examination (FIG. 7B) and is fixed to the subject under examination at a position corresponding to the purpose of the examination. The fixing may be performed using a belt (not shown) provided in the fixing unit 31. Alternatively, in a case where means for locking the slider (or the member engaging with the groove) to which the movable coil 20 is fixed is provided in the movable unit 33, the locking means is used for the fixing at a predetermined position.

The locking means can fix the slider at any position, whereby the movable coil unit 20 can be mounted at a desired position corresponding to the size of the subject under examination or at an appropriate position depending on whether or not the subject under examination has claustrophobia.

After that, transporting the table 102 into the static magnetic field space formed by the magnet 110 and performing the examination are the same as those of a normal MRI apparatus, and the nuclear magnetic resonance signals generated by the subject under examination are received by the respective coil units 10 and 20 of the high-frequency coil device 1 mounted on the subject under examination. In this case, since substantially the same overlapping area between the conductor loop 21 of the movable coil 20 and the conductor loop 11 of the fixed coil 10 can be maintained even in a case where the position of the movable coil 20 changes in a predetermined range with respect to the fixed coil 10, there is no decrease in sensitivity due to the change in the electromagnetic interference, and the uniformity of the sensitivity distribution is maintained. As a result, a high-quality image can be obtained.

In the embodiment of FIG. 11, a case where the high-frequency coil device of the embodiment of the present invention is used as the RF reception coil 161 has been described. However, regardless of the presence or absence of the RF transmission coil 151, the high-frequency coil device used as the RF reception coil 161 can also be used for transmission, and in this case, uniform and high irradiation sensitivity can be realized.

EXPLANATION OF REFERENCES

1, 1A, 1B: high-frequency coil device
10: coil unit (fixed coil)
20: coil unit (movable coil)
11, 12: conductor loop
30: mechanism unit
31: fixing unit
33: movable unit
331: rail
332: slider
335: arm portion
336: fixing member
100: MRI apparatus
151: RF transmission coil
161: RF reception coil

What is claimed is:

1. A high-frequency coil device for magnetic resonance imaging, comprising:
   a first coil unit having at least one conductor loop;
   a second coil unit having at least one conductor loop; and
   a mechanism unit configured to move at least one of the first coil unit and the second coil unit to make a relative position thereof variable,
   the first coil unit and the second coil unit being disposed, respectively, to be physically independent from each other, and one or more conductor loops of each of the first coil unit and the second coil unit being electromagnetically coupled to each other,
   wherein the mechanism unit is configured to maintain, when at least one of the first coil unit and the second coil unit is moved, electromagnetic coupling between a conductor loop of the first coil unit and an adjacent conductor loop of the second coil unit in at least a part of a movable range.

2. The high-frequency coil device according to claim 1, wherein some conductor loops of the first coil unit and of the second coil unit are disposed at substantially point-symmetric positions with respect to a point between the first coil unit and the second coil unit as a center.

3. The high-frequency coil device according to claim 1, wherein the mechanism unit comprises:

a fixing unit to which the first coil unit is fixed; and a movable unit having one end fixed to the fixing unit and another end to which the second coil unit is attached, the movable unit being configured to move the second coil unit along a trajectory so as to maintain the electromagnetic coupling.

4. The high-frequency coil device according to claim 3, wherein the trajectory of the movable unit is any of a circular trajectory, an elliptical trajectory, or a polygonal trajectory.

5. The high-frequency coil device according to claim 3, wherein the first coil unit and the second coil unit are movable with a constant overlapping area between some conductor loops thereof.

6. The high-frequency coil device according to claim 1, which is a coil for examination by magnetic resonance imaging of an anatomical head.

7. A magnetic resonance imaging apparatus comprising:

an RF transmission coil configured to apply a high-frequency magnetic field to a subject under examination; and an RF reception coil configured to detect a nuclear magnetic resonance signal from the subject under examination, wherein at least one of the RF transmission coil or the RF reception coil is a high-frequency coil device comprising:

a first coil unit having at least one conductor loop;

a second coil unit having at least one conductor loop; and a mechanism unit configured to move at least one of the first coil unit and the second coil unit to make a relative position thereof variable, the first coil unit and the second coil unit being disposed, respectively, to be physically independent from each other, and one or more conductor loops of each of the first coil unit and the second coil unit being electro-magnetically coupled to each other, and wherein the mechanism unit is configured to maintain, when at least one of the first coil unit and the second coil unit is moved, electromagnetic coupling between a conductor loop of the first coil unit and an adjacent conductor loop of the second coil unit in at least a part of a movable range.

8. The magnetic resonance imaging apparatus according to claim 7, wherein a dual-purpose RF coil that serves as both the RF transmission coil and the RF reception coil is provided, and the dual-purpose RF coil is the high-frequency coil device.

9. The magnetic resonance imaging apparatus according to claim 7, wherein the RF reception coil is a reception coil for examination by magnetic resonance imaging of an anatomical head and is the high-frequency coil device.

10. The magnetic resonance imaging apparatus according to claim 7, wherein some conductor loops of the first coil unit and of the second coil unit are disposed at substantially point-symmetric positions with respect to a point between the first coil unit and the second coil unit as a center.

11. The magnetic resonance imaging apparatus according to claim 7, wherein the mechanism unit comprises:

a fixing unit to which the first coil unit is fixed; and a movable unit having one end fixed to the fixing unit and another end to which the second coil unit is attached, the movable unit being configured to move the second coil unit along a trajectory so as to maintain the electromagnetic coupling.

12. The magnetic resonance imaging apparatus according to claim 11, wherein the trajectory of the movable unit is any of a circular trajectory, an elliptical trajectory, or a polygonal trajectory.

13. The magnetic resonance imaging apparatus according to claim 11, wherein the first coil unit and the second coil unit are movable with a constant overlapping area between some conductor loops thereof.

14. The magnetic resonance imaging apparatus according to claim 7, wherein the high-frequency coil device is a coil for head examination.

\*    \*    \*    \*    \*